US012581880B2

(12) United States Patent
Naik et al.

(10) Patent No.: US 12,581,880 B2
(45) Date of Patent: Mar. 17, 2026

(54) FARADAY FACEPLATE

(71) Applicant: Applied Materials, Inc., Santa Clara, CA (US)

(72) Inventors: Rutvij Naik, San Jose, CA (US); Vijay Sarthy Mysore Sreedhara, Redwood City, CA (US); Xiaopu Li, San Jose, CA (US); Shawyon Jafari, Sunnyvale, CA (US); Chidambara A. Ramalingam, Fremont, CA (US); Edward P. Hammond, Hillsborough, CA (US); Juan Carlos Rocha-Alvarez, San Carlos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 578 days.

(21) Appl. No.: 17/979,572

(22) Filed: Nov. 2, 2022

(65) Prior Publication Data
US 2024/0145252 A1 May 2, 2024

(51) Int. Cl.
*H01J 37/32* (2006.01)
*H01L 21/3065* (2006.01)

(52) U.S. Cl.
CPC .... *H01L 21/3065* (2013.01); *H01J 37/32623* (2013.01)

(58) Field of Classification Search
CPC ....................... H01J 37/32623; H01L 21/3065
USPC ..................................................... 156/345.46
See application file for complete search history.

(56) References Cited

U.S. PATENT DOCUMENTS

| | | | | |
|---|---|---|---|---|
| 2007/0079936 A1* | 4/2007 | Li | ..................... | H01J 37/32082 156/60 |
| 2008/0017104 A1* | 1/2008 | Matyushkin | ........ | H01L 21/6831 118/58 |
| 2012/0222815 A1* | 9/2012 | Sabri | ................. | C23C 16/45565 239/436 |
| 2016/0379851 A1* | 12/2016 | Swaminathan | ... | H01J 37/32743 438/715 |

(Continued)

FOREIGN PATENT DOCUMENTS

| | | |
|---|---|---|
| CN | 104282521 B | 7/2017 |
| CN | 110226222 A | 9/2019 |

(Continued)

OTHER PUBLICATIONS

Application No. PCT/US2023/077273 , International Search Report and the Written Opinion, Mailed On Feb. 13, 2024, 10 pages.

(Continued)

*Primary Examiner* — Charlee J. C. Bennett
(74) *Attorney, Agent, or Firm* — Kilpatrick Townsend & Stockton LLP

(57) ABSTRACT

Exemplary semiconductor processing chamber faceplates may include a body having a first surface and a second surface opposite the first surface. The body may define a plurality of apertures that extend through one or both of the first surface and the second surface. The faceplates may include a heater disposed within an interior of the body. The faceplates may include a first RF mesh disposed between the heater and the first surface. The faceplates may include a second RF mesh disposed between the heater and the second surface. The first RF mesh and the second RF mesh may be coupled together and form a Faraday cage about the heater.

20 Claims, 6 Drawing Sheets

(56) References Cited

U.S. PATENT DOCUMENTS

| | | | |
|---|---|---|---|
| 2017/0098564 A1* | 4/2017 | Pape | H01L 21/67346 |
| 2017/0280509 A1* | 9/2017 | Takebayashi | H05B 3/286 |
| 2020/0090972 A1 | 3/2020 | Benjaminson et al. | |
| 2022/0181120 A1* | 6/2022 | Ma | C23C 16/4586 |
| 2022/0208529 A1* | 6/2022 | Long | H01J 37/321 |

FOREIGN PATENT DOCUMENTS

| | | | |
|---|---|---|---|
| CN | 112771654 A | 5/2021 |
| JP | 2016054303 A | 4/2016 |
| JP | 2022541054 A | 9/2022 |
| KR | 20180126388 A | 11/2018 |
| TW | 201807770 A | 3/2018 |
| WO | 2021080953 A1 | 4/2021 |

OTHER PUBLICATIONS

International Application No. PCT/US2023/077273, International Preliminary Report on Patentability mailed on May 15, 2025, 6 pages.

Taiwanese Application No. 112141532, Notice of Decision to Grant mailed on Sep. 3, 2025, 4 pages (2 pages of English Translation and 2 pages of original document).

Taiwanese Application No. 112141532, Office Action mailed on Nov. 4, 2024, 6 pages (1 page of English Translation and 5 pages of original document).

* cited by examiner

300

320    310

400

FARADAY FACEPLATE

TECHNICAL FIELD

The present technology relates to semiconductor processing equipment. More specifically, the present technology relates to semiconductor chamber components and methods of substrate processing.

BACKGROUND

Plasma is used in various operations during substrate processing. In some applications, plasma is intended to be generated only below the faceplate during substrate processing, within a processing region of the substrate processing system. However, unwanted plasma (called parasitic plasma) can be inadvertently generated at locations outside of the processing region. This parasitic plasma can cause various issues, including an increased risk of substrate contamination, temperature non-uniformity across the substrate, and failure of certain components of the substrate processing system.

As such, it would be beneficial for a substrate processing system to minimize the parasitic plasma.

SUMMARY

Exemplary semiconductor processing chamber faceplates may include a body having a first surface and a second surface opposite the first surface. The body may define a plurality of apertures that extend through one or both of the first surface and the second surface. The faceplates may include a heater disposed within an interior of the body. The faceplates may include a first RF mesh disposed between the heater and the first surface. The faceplates may include a second RF mesh disposed between the heater and the second surface. The first RF mesh and the second RF mesh may be coupled together and form a Faraday cage about the heater.

In some embodiments, the faceplates may include one or more conduits disposed within the interior of the body. The one or more conduits being fluidly coupled with the plurality of apertures. The one or more conduits may form a recursive pattern that distributes gas radially outward about an area of the faceplate. The body may include a first strut securing the heater to the first conductive mesh. The body may include a second strut securing the heater to the second conductive mesh. A portion of the first strut may extend through the first surface of the body. An insulating sleeve may circumferentially surround the portion of the first strut. The insulating sleeve may include a ceramic material. The portion of the first strut may be coupled with a grounding RF strap. The body may be made of a ceramic material.

Some embodiments of the present technology may encompass semiconductor processing chamber faceplates. The faceplates may include a ceramic body having a first surface and a second surface opposite the first surface. The body may define a plurality of apertures that extend through one or both of the first surface and the second surface. The faceplates may include a heater disposed within an interior of the body. The faceplates may include a Faraday cage disposed within the interior of the body and formed about the heater.

In some embodiments, the Faraday cage may include a first RF mesh. The faceplate may include a first strut securing the heater to the first RF mesh. The Faraday cage may include a second RF mesh. The faceplate may include a second strut securing the heater to the second RF mesh.

The plurality of apertures may extend only through the second surface of the body. The faceplates may include a shaft coupled with the body. The shaft may include a grounding rod. An edge of the body may include an RF grounding strap.

Some embodiments of the present technology may encompass semiconductor processing chambers. The chambers may include a chamber body defining a processing chamber. The chambers may include a substrate support disposed within the processing chamber. The chambers may include a faceplate positioned atop the chamber body. The faceplate may be characterized by a first surface and a second surface opposite the first surface. The second surface may face the substrate support. The faceplate may define a plurality of apertures that extend through one or both of the first surface and the second surface. A heater may be disposed within an interior of the faceplate. A first RF mesh may be disposed between the heater and the first surface. A second RF mesh may be disposed between the heater and the second surface. The first RF mesh and the second RF mesh may be coupled together and form a Faraday cage about the heater.

In some embodiments, an edge of the faceplate may include a grounding component coupled with at least one lid stack component. The grounding component may be coupled with the Faraday cage. The grounding component may be coupled with the Faraday cage via a strut that extends through the first surface. A portion of the strut that extends outward from the faceplate may include a ceramic sleeve.

BRIEF DESCRIPTION OF THE DRAWINGS

A further understanding of the nature and advantages of the disclosed technology may be realized by reference to the remaining portions of the specification and the drawings.

Figure 1A:
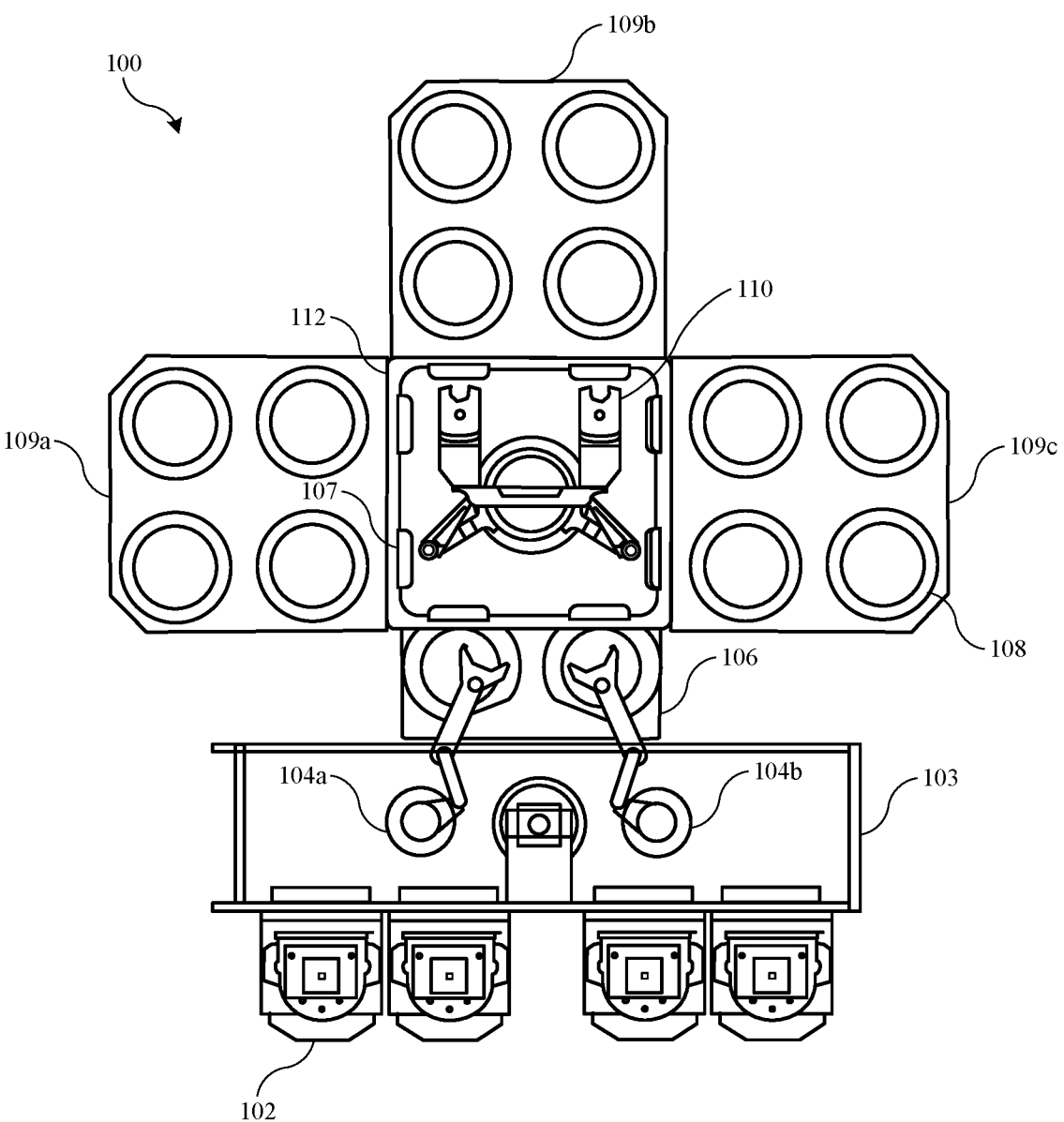
FIG. 1A shows a schematic top view of an exemplary processing tool according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Substrate processing can include time-intensive operations for adding, removing, or otherwise modifying materials on a wafer or semiconductor substrate. Efficient movement of the substrate may reduce queue times and improve substrate throughput. To improve the number of substrates processed within a cluster tool, additional chambers may be incorporated onto the mainframe. Although transfer robots and processing chambers can be continually added by lengthening the tool, this may become space inefficient as the footprint of the cluster tool scales. Accordingly, the present technology may include cluster tools with an increased number of processing chambers within a defined footprint. To accommodate the limited footprint about transfer robots, the present technology may increase the number of processing chambers laterally outward from the robot. For example, some conventional cluster tools may include one or two processing chambers positioned about sections of a centrally located transfer robot to maximize the number of chambers radially about the robot. The present technology may expand on this concept by incorporating additional chambers laterally outward as another row or group of chambers. For example, the present technology may be applied with cluster tools including three, four, five, six, or more processing chambers accessible at each of one or more robot access positions.

However, as additional process locations are added, accessing these locations from a central robot may no longer be feasible without additional transfer capabilities at each location. Some conventional technologies may include wafer carriers on which the substrates remain seated during transition. However, wafer carriers may contribute to thermal non-uniformity and particle contamination on substrates. The present technology overcomes these issues by incorporating a transfer section vertically aligned with processing chamber regions and a carousel or transfer apparatus that may operate in concert with a central robot to access additional wafer positions.

Many deposition and cleaning operations are more effective and/or efficient at high temperatures, such as temperatures that exceed 400° C., 500° C., 600° C., or more. Conventionally, faceplates are formed from aluminum, which may sag or otherwise deform at such high temperatures. Additionally, some conventional processing systems may be designed to generate plasma only within the processing region (e.g., between the faceplate and a substrate support). However, the presence of an electric field above the faceplate may cause parasitic plasma to be generated on chamber components above the faceplate. This parasitic plasma may cause numerous issues. For example, the parasitic plasma may create a source of power loss that takes away from power used to deposit material on substrates within the processing region. The parasitic plasma may create particle issues due to the residue of the parasitic plasma peeling from surfaces of the processing system that are not easily reached during chamber cleaning operations. The formation of parasitic plasma may create process non-uniformity, as the generation of plasma (and subsequent power loss) may cause the generation of plasma within the processing region to be asymmetric. Additionally, the parasitic plasma may contribute to chamber matching issues, as the amount of parasitic plasma generated from chamber to chamber may vary.

The present technology overcomes these challenges by utilizing faceplates that are formed from a ceramic material that is able to withstand temperatures in excess of 600° C. This may enable the faceplates to be used in high temperature processing and/or cleaning operations. Additionally, embodiments of faceplates may integrate a Faraday cages that surround heating elements disposed within the faceplate itself. The use of such Faraday cages may help reduce the amount of electric field present above the faceplate and may subsequently reduce or eliminate the generation of any parasitic plasma on chamber components above the faceplate. In some reduce the amount of electric field present above the faceplate embodiments, the peripheral edge of the faceplate may be grounded, which may further reduce the amount of electric field present above the faceplate. Thus, the present technology may enable the performance of higher temperature processes, while also helping to reduce or eliminate the presence of parasitic plasma within a processing system.

Although the remaining disclosure will routinely identify specific structures, such as four-position transfer regions, for which the present structures and methods may be employed, it will be readily understood that the systems and methods are equally applicable to any number of structures and devices that may benefit from the transfer capabilities explained. Accordingly, the technology should not be considered to be so limited as for use with any particular structures alone. Moreover, although an exemplary tool system will be described to provide foundation for the present technology, it is to be understood that the present technology can be incorporated with any number of semiconductor processing chambers and tools that may benefit from some or all of the operations and systems to be described.

FIG. 1A shows a top plan view of one embodiment of a substrate processing tool or processing system 100 of deposition, etching, baking, and curing chambers according to some embodiments of the present technology. In the figure, a set of front-opening unified pods 102 supply substrates of a variety of sizes that are received within a factory interface 103 by robotic arms 104a and 104b and placed into a load lock or low pressure holding area 106 before being delivered to one of the substrate processing regions 108, positioned in chamber systems or quad sections 109a-c, which may each be a substrate processing system having a transfer region fluidly coupled with a plurality of processing regions 108. Although a quad system is illustrated, it is to be understood that platforms incorporating standalone chambers, twin chambers, and other multiple chamber systems are equally encompassed by the present technology. A second robotic arm 110 housed in a transfer chamber 112 may be used to transport the substrate wafers from the holding area 106 to the quad sections 109 and back, and second robotic arm 110 may be housed in a transfer chamber with which each of the quad sections or processing systems may be connected. Each substrate processing region 108 can be outfitted to perform a number of substrate processing operations including any number of deposition processes including cyclical layer deposition, atomic layer deposition, chemical vapor deposition, physical vapor deposition, as well as etch, pre-clean, anneal, plasma processing, degas, orientation, and other substrate processes.

Each quad section 109 may include a transfer region that may receive substrates from, and deliver substrates to, second robotic arm 110. The transfer region of the chamber system may be aligned with the transfer chamber having the second robotic arm 110. In some embodiments the transfer region may be laterally accessible to the robot. In subsequent operations, components of the transfer sections may vertically translate the substrates into the overlying processing regions 108. Similarly, the transfer regions may also be operable to rotate substrates between positions within each transfer region. The substrate processing regions 108 may include any number of system components for depositing, annealing, curing and/or etching a material film on the substrate or wafer. In one configuration, two sets of the processing regions, such as the processing regions in quad section 109*a* and 109*b*, may be used to deposit material on the substrate, and the third set of processing chambers, such as the processing chambers or regions in quad section 109*c*, may be used to cure, anneal, or treat the deposited films. In another configuration, all three sets of chambers, such as all twelve chambers illustrated, may be configured to both deposit and/or cure a film on the substrate.

As illustrated in the figure, second robotic arm 110 may include two arms for delivering and/or retrieving multiple substrates simultaneously. For example, each quad section 109 may include two accesses 107 along a surface of a housing of the transfer region, which may be laterally aligned with the second robotic arm. The accesses may be defined along a surface adjacent the transfer chamber 112. In some embodiments, such as illustrated, the first access may be aligned with a first substrate support of the plurality of substrate supports of a quad section. Additionally, the second access may be aligned with a second substrate support of the plurality of substrate supports of the quad section. The first substrate support may be adjacent to the second substrate support, and the two substrate supports may define a first row of substrate supports in some embodiments. As shown in the illustrated configuration, a second row of substrate supports may be positioned behind the first row of substrate supports laterally outward from the transfer chamber 112. The two arms of the second robotic arm 110 may be spaced to allow the two arms to simultaneously enter a quad section or chamber system to deliver or retrieve one or two substrates to substrate supports within the transfer region.

Any one or more of the transfer regions described may be incorporated with additional chambers separated from the fabrication system shown in different embodiments. It will be appreciated that additional configurations of deposition, etching, annealing, and curing chambers for material films are contemplated by processing system 100. Additionally, any number of other processing systems may be utilized with the present technology, which may incorporate transfer systems for performing any of the specific operations, such as the substrate movement. In some embodiments, processing systems that may provide access to multiple processing chamber regions while maintaining a vacuum environment in various sections, such as the noted holding and transfer areas, may allow operations to be performed in multiple chambers while maintaining a particular vacuum environment between discrete processes.

Figure 1B:
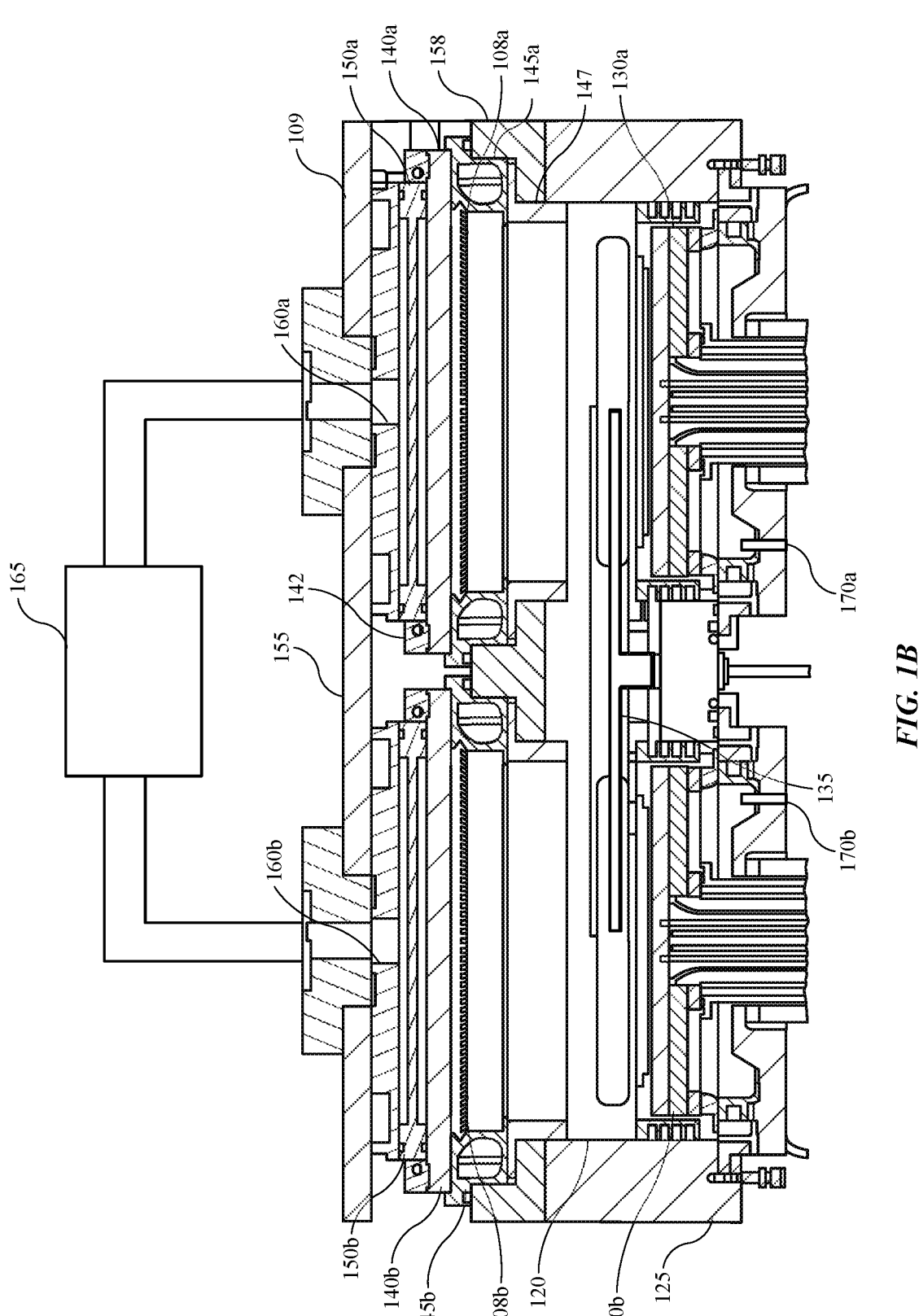
FIG. 1B shows a schematic partial cross-sectional view of an exemplary processing system according to some embodiments of the present technology.

FIG. 1B shows a schematic cross-sectional elevation view of one embodiment of an exemplary processing tool, such as through a chamber system, according to some embodiments of the present technology. FIG. 1B may illustrate a cross-sectional view through any two adjacent processing regions 108 in any quad section 109. The elevation view may illustrate the configuration or fluid coupling of one or more processing regions 108 with a transfer region 120. For example, a continuous transfer region 120 may be defined by a transfer region housing 125. The housing may define an open interior volume in which a number of substrate supports 130 may be disposed. For example, as illustrated in FIG. 1A, exemplary processing systems may include four or more, including a plurality of substrate supports 130 distributed within the housing about the transfer region. The substrate supports may be pedestals as illustrated, although a number of other configurations may also be used. In some embodiments the pedestals may be vertically translatable between the transfer region 120 and the processing regions overlying the transfer region. The substrate supports may be vertically translatable along a central axis of the substrate support along a path between a first position and a second position within the chamber system. Accordingly, in some embodiments each substrate support 130 may be axially aligned with an overlying processing region 108 defined by one or more chamber components.

The open transfer region may afford the ability of a transfer apparatus 135, such as a carousel, to engage and move substrates, such as rotationally, between the various substrate supports. The transfer apparatus 135 may be rotatable about a central axis. This may allow substrates to be positioned for processing within any of the processing regions 108 within the processing system. The transfer apparatus 135 may include one or more end effectors that may engage substrates from above, below, or may engage exterior edges of the substrates for movement about the substrate supports. The transfer apparatus may receive substrates from a transfer chamber robot, such as robot 110 described previously. The transfer apparatus may then rotate substrates to alternate substrate supports to facilitate delivery of additional substrates.

Once positioned and awaiting processing, the transfer apparatus may position the end effectors or arms between substrate supports, which may allow the substrate supports to be raised past the transfer apparatus 135 and deliver the substrates into the processing regions 108, which may be vertically offset from the transfer region. For example, and as illustrated, substrate support 130*a* may deliver a substrate into processing region 108*a*, while substrate support 130*b* may deliver a substrate into processing region 108*b*. This may occur with the other two substrate supports and processing regions, as well as with additional substrate supports and processing regions in embodiments for which additional processing regions are included. In this configuration, the substrate supports may at least partially define a processing region 108 from below when operationally engaged for processing substrates, such as in the second position, and the processing regions may be axially aligned with an associated substrate support. The processing regions may be defined from above by a faceplate 140, as well as other lid stack components. In some embodiments, each processing region may have individual lid stack components, although in some embodiments components may accommodate multiple processing regions 108. Based on this configuration, in some embodiments each processing region 108 may be fluidly coupled with the transfer region, while being fluidly isolated from above from each other processing region within the chamber system or quad section.

In some embodiments the faceplate 140 may operate as an electrode of the system for producing a local plasma within the processing region 108. As illustrated, each processing region may utilize or incorporate a separate faceplate. For example, faceplate 140*a* may be included to define from above processing region 108*a*, and faceplate 140*b* may be included to define from above processing region 108*b*. In some embodiments the substrate support may operate as the companion electrode for generating a capacitively-coupled plasma between the faceplate and the substrate support. The faceplate may be heated in some embodiments with a heater 142 extending about the faceplate. A pumping liner 145 may at least partially define the processing region 108 radially, or laterally depending on the volume geometry. Again, separate pumping liners may be utilized for each processing region. For example, pumping liner 145a may at least partially radially define processing region 108a, and pumping liner 145b may at least partially radially define processing region 108b. The pumping liners 145 may be seated on a choke plate 147, which may control heat distribution from the lid stack to the cooled chamber body. A blocker plate 150 may be positioned between a lid 155 and the faceplate 140 in embodiments, and again separate blocker plates may be included to facilitate fluid distribution within each processing region. For example, blocker plate 150a may be included for distribution towards processing region 108a, and blocker plate 150b may be included for distribution towards processing region 108b.

Lid 155 may be a separate component for each processing region, or may include one or more common aspects. Lid 155 may be one of two separate lid plates of the system in some embodiments. For example, a first lid plate 158 may be seated over transfer region housing 125. The transfer region housing may define an open volume, and first lid plate 158 may include a number of apertures through the lid plate separating the overlying volume into specific processing regions. In some embodiments, such as illustrated, lid 155 may be a second lid plate, and may be a single component defining multiple apertures 160 for fluid delivery to individual processing regions. For example, lid 155 may define a first aperture 160a for fluid delivery to processing region 108a, and lid 155 may define a second aperture 160b for fluid delivery to processing region 108b. Additional apertures may be defined for additional processing regions within each section when included. In some embodiments, each quad section 109—or multi-processing-region section that may accommodate more or less than four substrates, may include one or more remote plasma units 165 for delivering plasma effluents into the processing chamber. In some embodiments individual plasma units may be incorporated for each chamber processing region, although in some embodiments fewer remote plasma units may be used. For example, as illustrated a single remote plasma unit 165 may be used for multiple chambers, such as two, three, four, or more chambers up to all chambers for a particular quad section. Piping may extend from the remote plasma unit 165 to each aperture 160 for delivery of plasma effluents for processing or cleaning in embodiments of the present technology.

In some embodiments a purge channel 170 may extend through the transfer region housing proximate or near each substrate support 130. For example, a plurality of purge channels may extend through the transfer region housing to provide fluid access for a fluidly coupled purge gas to be delivered into the transfer region. The number of purge channels may be the same or different, including more or less, than the number of substrate supports within the processing system. For example, a purge channel 170 may extend through the transfer region housing beneath each substrate support. With the two substrate supports 130 illustrated, a first purge channel 170a may extend through the housing proximate substrate support 130a, and a second purge channel 170b may extend through the housing proximate substrate support 130b. It is to be understood that any additional substrate supports may similarly have a plumbed purge channel extending through the transfer region housing to provide a purge gas into the transfer region.

When purge gas is delivered through one or more of the purge channels, it may be similarly exhausted through pumping liners 145, which may provide all exhaust paths from the processing system. Consequently, in some embodiments both the processing precursors and the purge gases may be exhausted through the pumping liners. The purge gases may flow upwards to an associated pumping liner, for example purge gas flowed through purge channel 170b may be exhausted from the processing system from pumping liner 145b.

Figure 2:
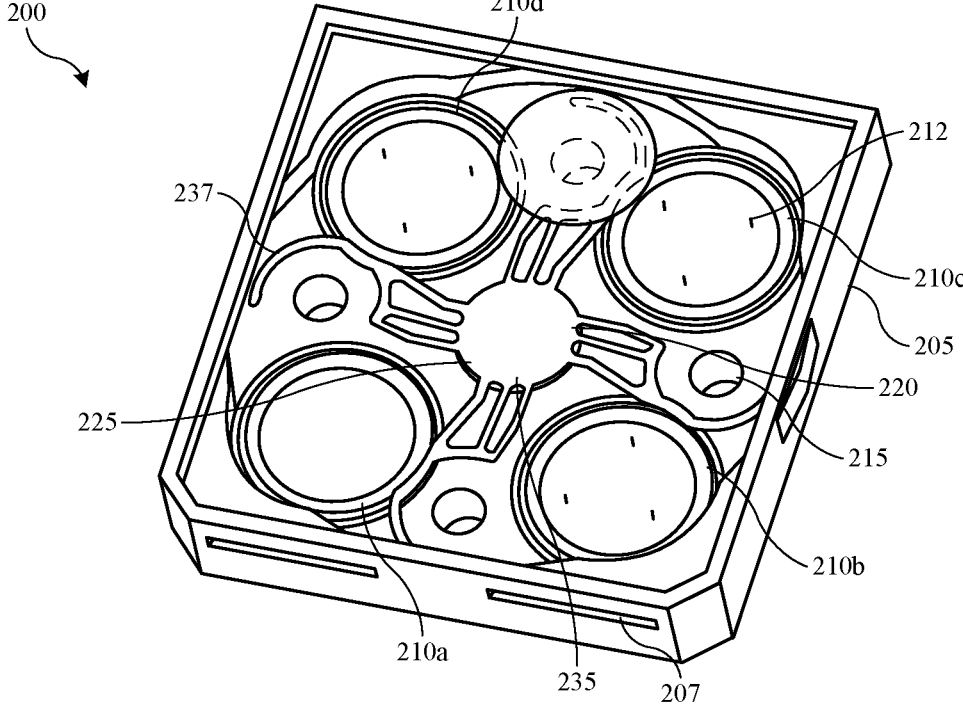
FIG. 2 shows a schematic isometric view of a transfer section of an exemplary substrate processing system according to some embodiments of the present technology.

As noted, processing system 100, or more specifically quad sections or chamber systems incorporated with processing system 100 or other processing systems, may include transfer sections positioned below the processing chamber regions illustrated. FIG. 2 shows a schematic isometric view of a transfer section of an exemplary chamber system 200 according to some embodiments of the present technology. FIG. 2 may illustrate additional aspects or variations of aspects of the transfer region 120 described above, and may include any of the components or characteristics described. The system illustrated may include a transfer region housing 205 defining a transfer region in which a number of components may be included. The transfer region may additionally be at least partially defined from above by processing chambers or processing regions fluidly coupled with the transfer region, such as processing chamber regions 108 illustrated in quad sections 109 of FIG. 1A. A sidewall of the transfer region housing may define one or more access locations 207 through which substrates may be delivered and retrieved, such as by second robotic arm 110 as discussed above. Access locations 207 may be slit valves or other sealable access positions, which include doors or other sealing mechanisms to provide a hermetic environment within transfer region housing 205 in some embodiments. Although illustrated with two such access locations 207, it is to be understood that in some embodiments only a single access location 207 may be included, as well as access locations on multiple sides of the transfer region housing. It is also to be understood that the transfer section illustrated may be sized to accommodate any substrate size, including 200 mm, 300 mm, 450 mm, or larger or smaller substrates, including substrates characterized by any number of geometries or shapes.

Within transfer region housing 205 may be a plurality of substrate supports 210 positioned about the transfer region volume. Although four substrate supports are illustrated, it is to be understood that any number of substrate supports are similarly encompassed by embodiments of the present technology. For example, greater than or about three, four, five, six, eight, or more substrate supports 210 may be accommodated in transfer regions according to embodiments of the present technology. Second robotic arm 110 may deliver a substrate to either or both of substrate supports 210a or 210b through the accesses 207. Similarly, second robotic arm 110 may retrieve substrates from these locations. Lift pins 212 may protrude from the substrate supports 210, and may allow the robot to access beneath the substrates. The lift pins may be fixed on the substrate supports, or at a location where the substrate supports may recess below, or the lift pins may additionally be raised or lowered through the substrate supports in some embodiments. Substrate supports 210 may be vertically translatable, and in some embodiments may extend up to processing chamber regions of the substrate processing systems, such as processing chamber regions 108, positioned above the transfer region housing 205.

The transfer region housing 205 may provide access 215 for alignment systems, which may include an aligner that can extend through an aperture of the transfer region housing as illustrated and may operate in conjunction with a laser, camera, or other monitoring device protruding or transmitting through an adjacent aperture, and that may determine whether a substrate being translated is properly aligned. Transfer region housing 205 may also include a transfer apparatus 220 that may be operated in a number of ways to position substrates and move substrates between the various substrate supports. In one example, transfer apparatus 220 may move substrates on substrate supports 210*a* and 210*b* to substrate supports 210*c* and 210*d*, which may allow additional substrates to be delivered into the transfer chamber. Additional transfer operations may include rotating substrates between substrate supports for additional processing in overlying processing regions.

Transfer apparatus 220 may include a central hub 225 that may include one or more shafts extending into the transfer chamber. Coupled with the shaft may be an end effector 235. End effector 235 may include a plurality of arms 237 extending radially or laterally outward from the central hub. Although illustrated with a central body from which the arms extend, the end effector may additionally include separate arms that are each coupled with the shaft or central hub in various embodiments. Any number of arms may be included in embodiments of the present technology. In some embodiments a number of arms 237 may be similar or equal to the number of substrate supports 210 included in the chamber. Hence, as illustrated, for four substrate supports, transfer apparatus 220 may include four arms extending from the end effector. The arms may be characterized by any number of shapes and profiles, such as straight profiles or arcuate profiles, as well as including any number of distal profiles including hooks, rings, forks, or other designs for supporting a substrate and/or providing access to a substrate, such as for alignment or engagement.

The end effector 235, or components or portions of the end effector, may be used to contact substrates during transfer or movement. These components as well as the end effector may be made from or include a number of materials including conductive and/or insulative materials. The materials may be coated or plated in some embodiments to withstand contact with precursors or other chemicals that may pass into the transfer chamber from an overlying processing chamber.

Additionally, the materials may be provided or selected to withstand other environmental characteristics, such as temperature. In some embodiments, the substrate supports may be operable to heat a substrate disposed on the support. The substrate supports may be configured to increase a surface or substrate temperature to temperatures greater than or about 100° C., greater than or about 200° C., greater than or about 300° C., greater than or about 400° C., greater than or about 500° C., greater than or about 600° C., greater than or about 700° C., greater than or about 800° C., or higher. Any of these temperatures may be maintained during operations, and thus components of the transfer apparatus 220 may be exposed to any of these stated or encompassed temperatures. Consequently, in some embodiments any of the materials may be selected to accommodate these temperature regimes, and may include materials such as ceramics and metals that may be characterized by relatively low coefficients of thermal expansion, or other beneficial characteristics.

Component couplings may also be adapted for operation in high temperature and/or corrosive environments. For example, where end effectors and end portions are each ceramic, the coupling may include press fittings, snap fittings, or other fittings that may not include additional materials, such as bolts, which may expand and contract with temperature, and may cause cracking in the ceramics. In some embodiments the end portions may be continuous with the end effectors, and may be monolithically formed with the end effectors. Any number of other materials may be utilized that may facilitate operation or resistance during operation, and are similarly encompassed by the present technology.

Figure 3:
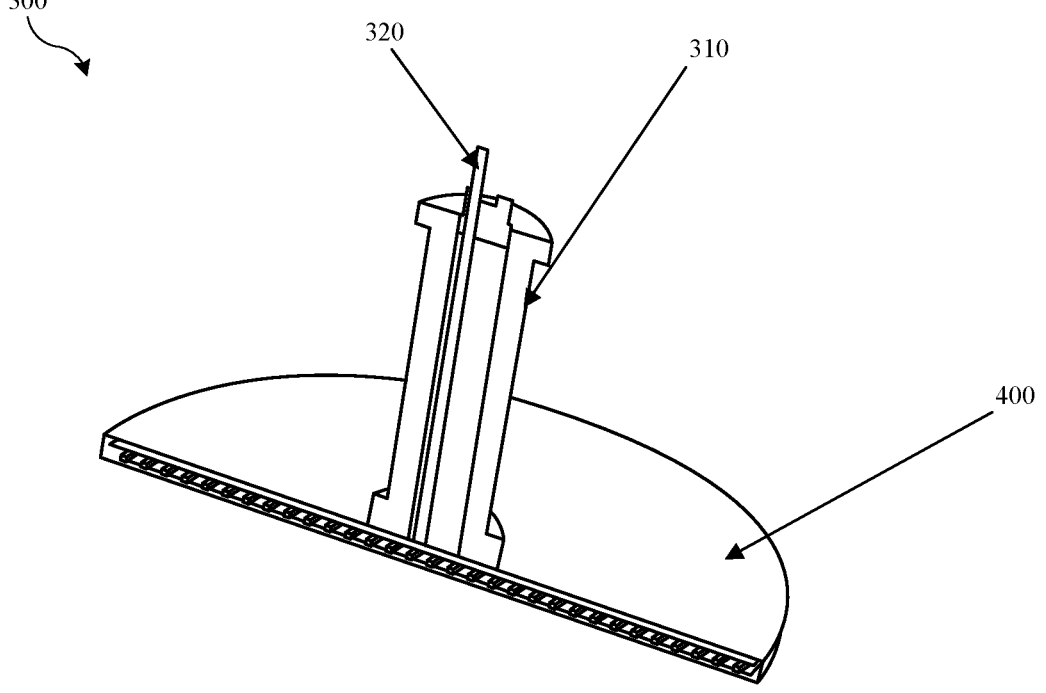
FIG. 3 shows a cross-sectional view of a faceplate arrangement of an exemplary substrate processing system according to some embodiments of the present technology.

FIG. 3 shows a cross-sectional view of an exemplary faceplate arrangement 300 arrangement of an exemplary substrate processing system according to some embodiments of the present technology. In particular, the faceplant arrangement 300 includes a shaft 310, a grounding rod 320, and a faceplate 400. The grounding rod 320 may be used to discharge the electrical current associated with the faceplate 400. The shaft 310 can house the grounding rod 320 and/or other components. For example, in some embodiments, one or more gas delivery lines may be disposed within the shaft 310. The gas delivery lines may be coupled with one or more gas sources and may be used to deliver one or more precursors, cleaning gases, inert gases, and/or other gases to a delivery volume of the faceplate 400.

Figure 4:
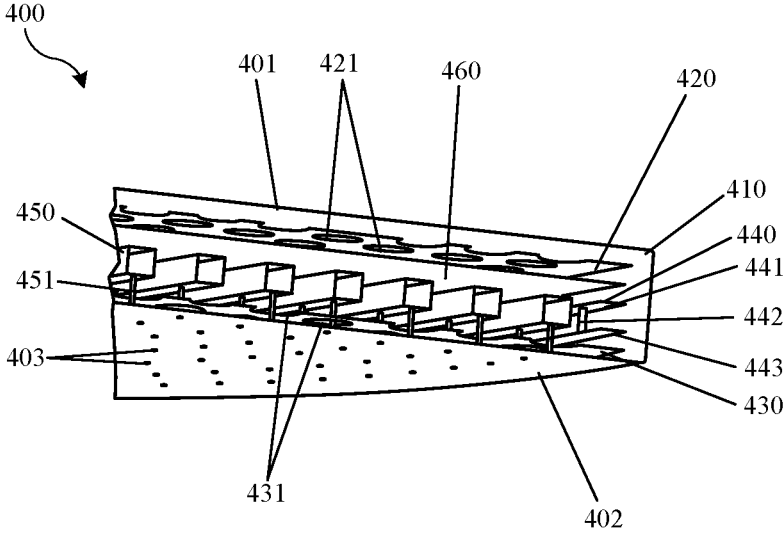
FIG. 4 shows a partial cross-section view of a faceplate of the faceplate processing system of FIG. 3.
Figure 5:
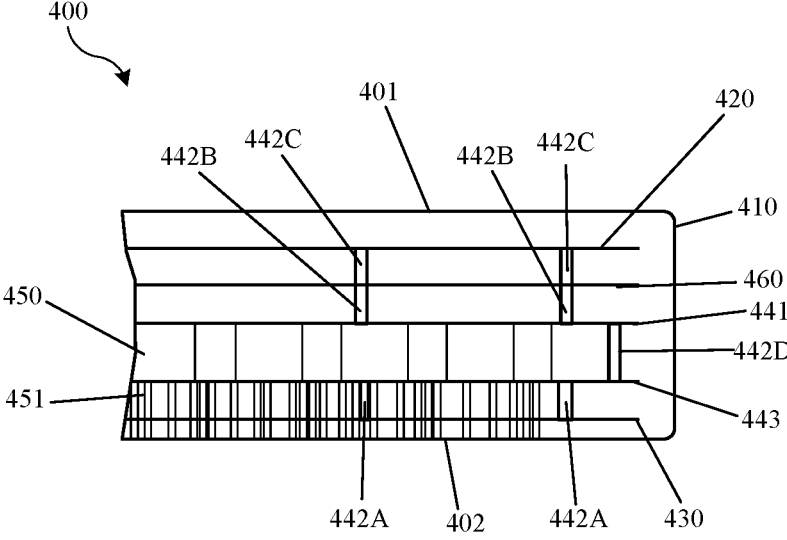
FIG. 5 shows a partial cross-section view of a faceplate of the faceplate processing system of FIG. 3.

FIGS. 4 and 5 show partial cross-sectional views of the faceplate 400 according to some embodiments of the present technology. FIGS. 4 and 5 may illustrate further details relating to components in system 100, such as for faceplate 140. Faceplate 400 is understood to include any feature or aspect of system 100 discussed previously in some embodiments. The faceplate 400 may be used to perform semiconductor processing operations including deposition of hardmask materials as previously described, as well as other deposition, removal, and cleaning operations. Faceplate 400 may show a partial view of a faceplate that may be incorporated in a semiconductor processing system, and may illustrate a view across a center of the faceplate, which may otherwise be of any size, and include any number of apertures. Although shown with a number of apertures extending outward laterally or radially, it is to be understood that the figure is included only for illustration of embodiments, and is not considered to be of scale. For example, exemplary faceplates may be characterized by a number of apertures along a central diameter of greater than or about 20 apertures as will be described further below, and may be characterized by greater than or about 25 apertures, greater than or about 30 apertures, greater than or about 35 apertures, greater than or about 40 apertures, greater than or about 45 apertures, greater than or about 50 apertures, or more.

As noted, faceplate 400 may be included in any number of processing chambers, including system 100 described above. Faceplate 400 may be included as part of the gas inlet assembly, such as with a gasbox and blocker plate. For example, a gasbox may define or provide access into a processing chamber. A substrate support may be included within the chamber, and may be configured to support a substrate for processing. A blocker plate may be included in the chamber between the gasbox and the substrate support. The blocker plate may include or define a number of apertures through the plate. The components may include any of the features described previously for similar components, as well as a variety of other modifications similarly encompassed by the present technology.

Faceplate 400 may be positioned within the chamber between the blocker plate and the substrate support in some embodiments as illustrated previously. The faceplate 400 may include a body 410 having a top (or first) surface 401 and a bottom (or second) surface 402 opposite the top surface 401. For example, in some embodiments first surface 401 may be facing towards a blocker plate, gasbox, or gas inlet into the processing chamber, while the second surface 402 may be positioned to face a substrate support or substrate within a processing region of a processing chamber. For example, in some embodiments, the second surface 402 of the faceplate 400 and the substrate support may at least partially define a processing region within the chamber. Faceplate 400 may be characterized by a central axis, which may extend vertically through a midpoint of the showerhead, and may be coaxial with a central axis through the processing chamber.

Faceplate 400 may define a plurality of apertures 403 defined through at least a portion of the faceplate 400. For example, in some embodiments the apertures 403 may extend from the first surface 401 through the second surface 402. In other words, each aperture 403 may extend through the full thickness of the faceplate 400. In other embodiments, each aperture 403 may be defined by and extend through only the second surface 402. For example, the faceplate 400 may define a central volume 470 and/or one or more recursive conduits 450 that may be fluidly coupled with the apertures 403 and that may receive one or more gases from one or more gas delivery lines (which may be provided within the shaft 310 in some embodiments). The gas from the delivery lines may be distributed within the central volume 470 and/or recursive conduits 450. Due to the small size of the apertures 403, the gases may flow radially outward within the central volume 470 and/or through the length of the recursive conduits 450 and pass through the apertures 403 formed across an entirety of the faceplate 403. Each aperture 403 may provide a fluid path through the faceplate 400, and the apertures 403 may provide fluid access to the processing region of the chamber. Depending on the size of the faceplate 400, and the size of the apertures 403, faceplate 400 may define any number of apertures 403 through the plate, such as greater than or about 1,000 apertures, greater than or about 2,000 apertures, greater than or about 3,000 apertures, greater than or about 4,000 apertures, greater than or about 5,000 apertures, greater than or about 6,000 apertures, or more. As noted above, the apertures may be included in a set of rings extending outward from the central axis, and may include any number of rings as described previously. The rings may be characterized by any number of shapes including circular or elliptical, as well as any other geometric pattern, such as rectangular, hexagonal, or any other geometric pattern that may include apertures distributed in a radially outward number of rings. The apertures may have a uniform or staggered spacing, and may be spaced apart at less than or about 10 mm from center to center. The apertures may also be spaced apart at less than or about 9 mm, less than or about 8 mm, less than or about 7 mm, less than or about 6 mm, less than or about 5 mm, less than or about 4 mm, less than or about 3 mm, or less.

The rings may be characterized by any geometric shape as noted above, and in some embodiments, apertures may be characterized by a scaling function of apertures per ring. For example, in some embodiments a first aperture may extend through a center of the faceplate, such as along the central axis. A first ring of apertures may extend about the central aperture, and may include any number of apertures, such as between about 4 and about 10 apertures, which may be spaced equally about a geometric shape extending through a center of each aperture. Any number of additional rings of apertures may extend radially outward from the first ring, and may include a number of apertures that may be a function of the number of apertures in the first ring. For example, the number of apertures in each successive ring may be characterized by a number of apertures within each corresponding ring according to the equation XR, where X is a base number of apertures, and R is the corresponding ring number. The base number of apertures may be the number of apertures within the first ring, and in some embodiments may be some other number, as will be described further below where the first ring has an augmented number of apertures. For example, for an exemplary faceplate having 5 apertures distributed about the first ring, and where 5 may be the base number of apertures, the second ring may be characterized by 10 apertures, (5)×(2), the third ring may be characterized by 15 apertures, (5)×(3), and the twentieth ring may be characterized by 100 apertures, (5)×(20). This may continue for any number of rings of apertures as noted previously, such as up to, greater than, or about 50 rings. In some embodiments each aperture of the plurality of apertures across the faceplate may be characterized by an aperture profile, which may be the same or different in embodiments of the present technology. For example, the aperture profile may be cylindrical as illustrated, or may be generally frustoconical in shape. In some embodiments, the aperture profile of some or all of the apertures may include multiple cylindrical and/or conical sections, and may include one or more choke regions. The aperture profile may be the same for each of the apertures, or may be different in various embodiments.

The body 410 may house a number of components for the faceplate 400. In particular, the body 410 may house a top (or first) RF mesh 420, a second (or bottom) RF mesh 430, a heater 460, supports 440, and/or conduits 450. As shown, the body 410 may entirely house the meshes 420, 430, heater 460, supports 440, and/or conduits 450. However, in other embodiments, at least a portion of one or more components may not be entirely housed within the body 410.

The heater 460 may be embedded within the body 410, as discussed above. The heater 460 may include one or more electrically conductive plates and/or coils that are used to heat the faceplate 400. For example, in some embodiments the heater 460 may include one or more coils and/or other heating elements that may extend through a portion of the central volume 470. For example, the coils may have a spiral shape that extends radially outward from a center of the faceplate 400 in some embodiments, while in other embodiments the coil may have other recursive shapes. In other embodiments, the heater 460 may include one or more generally disc-shaped plates that at least substantially (e.g., greater than 90%, greater than 95%, greater than 97%, greater than 99%, etc.) fill, extend across, and/or otherwise span a cross-sectional area of the faceplate 400. The heater 460 may be coupled with a power source, such as an AC power source, which may supply a current to the heater 460 to increase the temperature of the faceplate 400 and any gases being flowed therethrough. The heater 460 may have a substantially similar circumferential area and/or diameter as the interior of the body 410 such that the heater 460 applies a substantially uniform heat distribution to the components within the body 410. However, in other embodiments, the heater may have a smaller circumferential area and/or diameter than the interior of the body 410 (e.g., where there is more than one heater).

As noted above, the body 410 may include and/or define one or more conduits 450. In some embodiments, the conduits 450 may include one or more recursive shapes that extend from a center of the faceplate 400 toward an outer periphery of the central volume 470. For example, the conduits 450 may include a spiral shape, a number of concentric rings, and/or other shapes that may be used to distribute one or more gases about the area of the faceplate 400. The conduits 450 each may include and/or be fluidly coupled with a number of channels 451 that each extend between the conduits 450 and a respective one of the apertures 403. In this manner, one or more gases be flowed through the conduits 450, the channels 451, and may exit the faceplate 400 via the apertures 403. In some applications, RF power may be supplied to the faceplate 400 and the pedestal to strike a plasma of the one or more gases within the processing region of the processing chamber. Although the conduits 450 are depicted as having rectangular cross-sections, it is understood that, in other embodiments, the cross-section of the conduits 450 may have other shapes (e.g., circular).

The first RF mesh 420 and the second RF mesh 430 may be positioned on opposing sides of the heater 460. In a particular embodiment, each RF mesh 420, 430 may be positioned between about 1 mm and 10 mm from a nearest respective surface (e.g., the first surface 401 or second surface 402), between 2 mm and 9 mm, between 3 mm and 8 mm, between 4 mm and 7 mm, or between 5 mm and 6 mm, with the spacing being dictated by the thickness of the body 410 in some embodiments. Outer peripheries of the RF meshes 420, 430 may extend radially outward to a same or greater distance as the heater 460, which may enable the RF meshes 420, 430 to be coupled together to completely surround a body of the heater 460. For example, a number of vias 442 may be used to couple the RF meshes 420, 430 together. The vias or struts 442 may extend directly between the RF meshes 420, 430, or may extend between one of the RF meshes 420, 430 and one or more intervening components. For example, as illustrated in FIG. 5, first vias 442a may extend between and couple the second RF mesh 430 and a reinforcement pad or flange 443. Second vias 442D may extend between and couple the reinforcement pad or flange 443 and a reinforcement pad or flange 441. Third vias 442B may extend between and couple the reinforcement pad or flange 441 and heater 460. Fourth vias 442A may extend between and couple the heater 460 with the first RF mesh 420. In this manner, the two RF meshes 420, 430 may be coupled together. It will be appreciated that more, fewer, and/or different intervening connections may be made to couple the two RF meshes 420, 430.

The first and second RF meshes 420, 430, vias 442, heater 460, and flanges 441, 443 may be made of a conductive material such that meshes 420, 430 form a Faraday cage that surrounds the conductive heater 460. The Faraday cage may help constrain the electric field generated during processing operations (e.g., from the heater 460 and/or from the RF field between the faceplate 400 and the pedestal that is used to strike plasma within the processing region) to the area below the faceplate 400. The reduction in electric field above the faceplate 400 may help reduce or eliminate the generation of parasitic plasma above the faceplate 400. The RF meshes 420, 430 may define openings 421, 431 respectively sized to form a mesh structure for formation of the Faraday cage. The openings 421, 431 may additionally be sized to allow a component to pass through the meshes 420, 430. For example, the openings 431 may be sized and/or positioned to allow for a portion of at least some of the channels 451 to pass through the mesh 430. In this manner, one or more gases may be pass through the RF meshes 420, 430 for delivery to the processing region.

Further, the RF meshes 420, 430 may have a circumferential area substantially similar as the interior of the body 410 such that the meshes 420, 430 forms a Faraday cage having substantially a similar circumferential area as the interior of the body 410 and, therefore, nearly the circumferential area of the faceplate 400. The size of this Faraday cage can help prevent electrical charge on one side of the faceplate 400 from passing through to the other side. For example, where the faceplate 400 is assembled in a substrate processing system, the Faraday cage created by meshes 420, 430 may help in preventing an electrical charge created below the faceplate 400 (e.g., between the faceplate 400 and pedestal (which serve as electrodes) during capacitively coupled plasma processes) from seeping to components of the substrate processing system above the faceplate 400. The prevention of this electrical charge assists in reducing or minimizing the formation of parasitic plasma above the faceplate 400.

The position of the components of the faceplate 400 within the body 410 may be reinforced by supports 440. The supports 440 may include a top (or first) flange or pad 441, a bottom (or second) flange or pad 443, and vias or struts 442 extending between the flanges 441, 443. The supports 440 may be monolithically formed such that the flanges 441, 443 and struts 442 are integral to each other. Alternatively, the flanges 441, 443 and struts 442 may be separately constructed before being engaged to each other (e.g., through welding or the like).

The flanges 441, 443 may be engaged to the body 410 (e.g., through welding or the like) such that any other components engaged to the flanges 441, 443 may be likewise supported by the body 410. For example, the flanges 441, 443 may be engaged to the conduits 450 to support a position of the conduits 450. In particular, a top flange 441 may be engaged to a top surface of the conduits 450 and the bottom flange 443 may be engaged to a bottom surface of the conduits 450. In this manner, the position of the conduits 450 may be supported by through the flanges 441, 443 and their connection to the body 410.

With specific reference to FIG. 5, the struts 442 are depicted as extending from the flanges 441, 443 toward other components within the body 410 to support a position of those components. For example, the struts 442A extend from the bottom flange 443 to engage with the bottom mesh 430. Additionally, struts 442B extend from the top flange 441 to engage with the heater 460. Separate struts 442C may extend from the heater 460 to the top mesh 420. The struts 442A, 442B, 442C, 442D may be engaged to the corresponding component through welding or the like. The positions of the meshes 420, 430 and the heater 460 can, therefore, be supported by their respective connection to the struts 442A, 442B, 442C, 442D, the struts 442A, 442B, 442C, 442D to the flanges 441, 443, and the flanges 441, 443 to the body 410.

In other embodiments, there may be additional flanges connecting at least one of the heater and meshes to the body. For example, each of the heater and meshes may include their own pair of flanges to connect each component to the body. Alternatively, the conduits are not engaged to flanges and, instead, one of the meshes or heater are engaged to flanges which are, in turn, engaged to the body. In a yet further alternative, the struts extending from the top flange are a monolithic structure such that the end of these struts are engaged to the top mesh and the top flange. In this example, the struts may go through the heater and the heater may be secured to a midsection of the struts.

The supports 440 may be made of a conductive material, such as tungsten. In this manner, the supports 440 may form a part of the Faraday cage along with the meshes 420, 430.

The body 410 may be made of an insulating material, such as ceramic, which may have a higher coefficient of thermal expansion than conductors such as aluminum. Suitable ceramics may include, for example, aluminum nitride and/or aluminum oxide. The higher coefficient of thermal expansion may enable the faceplate 400 to be used in high temperature processing and cleaning operations, such as operations that include operating temperatures in excess of 250° C., 300° C., 350° C., 400° C., 450° C., 500° C., 550° C., 600° C., or greater.

Figure 6:
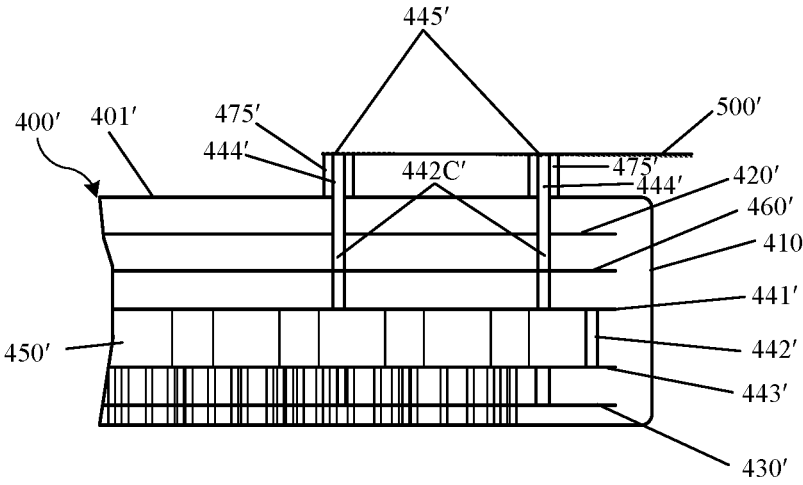
FIG. 6 show a partial cross-sectional view of an exemplary faceplate arrangement of an exemplary substrate processing system according to some embodiments of the present technology.

Although the faceplate 400 may provide a substantial reduction in the electrical charge to regions of the processing system above the faceplate 400, further protection from the electrical charge may be desired. FIG. 6 depicts an exemplary faceplate 400', which may be similar to the faceplate 400 except as noted below. In this embodiment, features having like reference numerals as features discussed above are similar except as noted below. The struts 442C' may each include a portion 444' of conductive material that extends past the top mesh 420' and the top surface 401'.

Each portion 444' includes an end 445' coupled to a grounding component 500' (e.g., a strap), which may be coupled with the chamber body and/or a lid stack component. The grounding component 500' may assist in dissipating electrical charge within the faceplate 400. As the struts 442C' may form a part of the Faraday cage, grounding the portions 444' may assist in eliminating electrical charges of the Faraday cage. This grounding can further minimize the risk of electrical charge from seeping above the faceplate 400'.

A sleeve 475' may circumferentially surround the portions 444' to prevent the portions 444' from being exposed to any process gasses and damaging the portions 444'. The sleeve 475' may be made of an insulating material, such as ceramic.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a plate" includes a plurality of such plates, and reference to "the aperture" includes reference to one or more apertures and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

Directional references such as "up," "upper," "lower," "down," "top," "left," "right," "bottom," among others, are not intended to be limiting and are instead intended to refer to the orientation as illustrated and described in the figure (or figures) to which the components and directions are referencing.

The invention claimed is:

1. A semiconductor processing chamber faceplate, comprising:
   a body having a first surface and a second surface opposite the first surface, the body defining a plurality of apertures that extend through one or both of the first surface and the second surface;
   a heater disposed within an interior of the body, wherein the heater extends through at least a portion of a central volume of the faceplate;
   a first RF mesh disposed between the heater and the first surface; and
   a second RF mesh disposed between the heater and the second surface, wherein the first RF mesh and the second RF mesh are coupled together and form a Faraday cage about the heater.

2. The semiconductor processing chamber faceplate of claim 1, further comprising:
   one or more conduits disposed within the interior of the body, the one or more conduits being fluidly coupled with the plurality of apertures.

3. The semiconductor processing chamber faceplate of claim 2,
   wherein the one or more conduits form a recursive pattern that distributes gas radially outward about an area of the faceplate.

4. The semiconductor processing chamber faceplate of claim 1, wherein the body comprises a first strut securing the heater to the first RF mesh.

5. The semiconductor processing chamber faceplate of claim 4, wherein the body includes a second strut securing the heater to the second RF mesh.

6. The semiconductor processing chamber faceplate of claim 4, wherein a portion of the first strut extends through the first surface of the body.

7. The semiconductor processing chamber faceplate of claim 6, wherein an insulating sleeve circumferentially surrounds the portion of the first strut.

8. The semiconductor processing chamber faceplate of claim 7, wherein the insulating sleeve comprises a ceramic material.

9. The semiconductor processing chamber faceplate of claim 6, wherein the portion of the first strut is coupled with a grounding RF strap.

10. The semiconductor processing chamber faceplate of claim 1, wherein the body is made of a ceramic material.

11. A semiconductor processing chamber faceplate, comprising:

a ceramic body having a first surface and a second surface opposite the first surface, the body defining a plurality of apertures that extend through one or both of the first surface and the second surface;

a heater disposed within an interior of the body, wherein the heater extends through at least a portion of a central volume of the faceplate; and a Faraday cage disposed within the interior of the body and formed about the heater.

12. The semiconductor processing chamber faceplate of claim 11, wherein:

the Faraday cage comprises a first RF mesh; and the faceplate further comprises a first strut securing the heater to the first RF mesh.

13. The semiconductor processing chamber faceplate of claim 12, wherein:

the Faraday cage comprises a second RF mesh; and the faceplate further comprises a second strut securing the heater to the second RF mesh.

14. The semiconductor processing chamber faceplate of claim 11, wherein the plurality of apertures extend only through the second surface of the body.

15. The semiconductor processing chamber faceplate of claim 14, further comprising:

a shaft coupled with the body, the shaft comprising a grounding rod.

16. The semiconductor processing chamber faceplate of claim 14, wherein an edge of the body comprises an RF grounding strap.

17. A semiconductor processing chamber, comprising: a chamber body defining the processing chamber; a substrate support disposed within the processing chamber; and a faceplate positioned atop the chamber body, wherein the faceplate is characterized by a first surface and a second surface opposite the first surface, the second surface facing the substrate support, wherein: the faceplate defines a plurality of apertures that extend through one or both of the first surface and the second surface; a heater is disposed within an interior of the faceplate, wherein the heater extends through at least a portion of a central volume of the faceplate; a first RF mesh is disposed between the heater and the first surface; a second RF mesh is disposed between the heater and the second surface; and the first RF mesh and the second RF mesh are coupled together and form a Faraday cage about the heater.

18. The semiconductor processing chamber of claim 17, wherein an edge of the faceplate comprises a grounding component coupled with at least one component of a lid stack.

19. The semiconductor processing chamber faceplate of claim 18, wherein the grounding component is coupled with the Faraday cage.

20. The semiconductor processing chamber of claim 18, wherein:

the grounding component is coupled with the Faraday cage via a strut that extends through the first surface; and a portion of the strut that extends outward from the faceplate comprises a ceramic sleeve.

\* \* \* \* \*